United States Patent
Tai et al.

(10) Patent No.: US 10,782,801 B1
(45) Date of Patent: Sep. 22, 2020

(54) INPUT DEVICE AND DIGITAL PEN FOR COLOR PICKING FROM A DISPLAY SCREEN

(71) Applicant: PRIMAX ELECTRONICS LTD., Taipei (TW)

(72) Inventors: Shou-Kuo Tai, Taipei (TW); Ting-Yu Liu, Taipei (TW); Wun-Ting Jheng, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 16/423,254

(22) Filed: May 28, 2019

(30) Foreign Application Priority Data

Mar. 15, 2019 (TW) .............................. 108108946 A

(51) Int. Cl.
G06F 3/0354 (2013.01)
H03K 17/96 (2006.01)
G06F 3/041 (2006.01)
G06F 1/16 (2006.01)

(52) U.S. Cl.
CPC ........ *G06F 3/03545* (2013.01); *G06F 1/1698* (2013.01); *G06F 3/0414* (2013.01); *H03K 17/9625* (2013.01)

(58) Field of Classification Search
CPC .......................... G06F 3/03545; G06F 1/1698
See application file for complete search history.

(56) References Cited

U.S. PATENT DOCUMENTS

2017/0048951 A1* 2/2017 Huang .................. H05B 47/19
2018/0181222 A1* 6/2018 Ivanov ................ G06F 3/03545

* cited by examiner

*Primary Examiner* — Chun-Nan Lin
(74) *Attorney, Agent, or Firm* — WPAT, PC

(57) ABSTRACT

An input device includes a digital pad and a digital pen. When a color picking switch of the digital pen is pressed by the user, the color picking switch generates a color picking signal. The color picking signal is transmitted to the digital pad or a computer through a wireless transmission module of the digital pen. According to the color picking signal, a color pointed through the digital pen is picked.

20 Claims, 6 Drawing Sheets

INPUT DEVICE AND DIGITAL PEN FOR COLOR PICKING FROM A DISPLAY SCREEN

FIELD OF THE INVENTION

The present invention relates to an input device, and more particularly to an input device with a digital pen.

BACKGROUND OF THE INVENTION

With the increasing development of science and technology, computer systems become essential electronic devices. Generally, a computer system comprises a host, a display screen and an input device. For example, the common input device includes a mouse or a keyboard. In addition, the cooperation of a digital pen and a graphics tablet provides the function of an input device. When the user holds the digital pen to write or draw on the graphics tablet, the writing content or the drawing content is sensed by the graphics tablet. Then, an input signal corresponding to the writing content or the drawing content is transmitted from the graphics tablet to the host. According to the input signal, the characters, symbols or drawings that written or drawn on the graphics tablet with the digital pen are shown on the display screen.

Generally, an editing program is installed on the host in order to operate the digital pen and the graphics tablet. When the editing program is executed, a tool bar is shown for the user to click, set or use. For example, the user may set the thickness, type or color of the input line on a corresponding position of the tool bar, or the user may use an eyedropper tool (or a color picker) of the tool bar to pick a color shown on the screen image to perform the subsequent drawing operation.

As mentioned above, the conventional digital pen has some drawbacks. When the user intends to pick a color shown on the screen image, the user cannot directly operate the digital pen with a finger to achieve this purpose. That is, after the editing program in the host is executed and the eyedropper tool (or the color picker) is used, the subsequent drawing operation is performed. The digital pen and the graphics tablet are not user-friendly to the regular users such as computer graphics designer.

In other words, the input device for writing or drawing by hand need to be further improved.

SUMMARY OF THE INVENTION

An object of the present invention provides a digital pen with a color picking switch. When the user's finger presses the color picking switch of the digital pen, a certain color shown on a screen image of a computer or a digital pad is picked and a subsequent action is performed.

Another object of the present invention provides an input device with the digital pen.

In accordance with an aspect of the present invention, a digital pen is provided. The digital pen includes a pen body, an electromagnetic circuit module, a color picking switch and a wireless transmission module. When the pen body is held by a user, the pen body is operable on the digital pad. The electromagnetic circuit module is disposed within the pen body. When the pen body is operated by the user, the electromagnetic circuit module issues an electromagnetic signal to the digital pad, and the digital pad or a computer in communication with the digital pad implements an input action according to the electromagnetic signal. At least a portion of the color picking switch is exposed outside the pen body. When the color picking switch is pressed by the user, a color picking signal is generated. The wireless transmission module disposed within the pen body and electrically connected with the color picking switch. The color picking signal is outputted through the wireless transmission module, and a color pointed through the digital pen is picked according to the color picking signal.

In accordance with another aspect of the present invention, an input device is provided. The input device includes a digital pad and a digital pen. The digital pad is in communication with a computer. The digital pen includes a pen body, an electromagnetic circuit module, a color picking switch and a wireless transmission module. When the pen body is held by a user, the pen body is operable on the digital pad. The electromagnetic circuit module is disposed within the pen body. When the pen body is operated by the user, the electromagnetic circuit module issues an electromagnetic signal to the digital pad, and the computer implements an input action according to the electromagnetic signal. At least a portion of the color picking switch is exposed outside the pen body. When the color picking switch is pressed by the user, a color picking signal is generated. The wireless transmission module is disposed within the pen body and electrically connected with the color picking switch. The color picking signal is transmitted to the digital pad or the computer through the wireless transmission module. After the color picking signal is acquired by the computer, a color shown on a screen image of the computer and pointed through the digital pen is picked according to the color picking signal.

In accordance with a further aspect of the present invention, an input device is provided. The input device includes a digital pad and a digital pen. A screen image is shown on the digital pad. The digital pen includes a pen body, an electromagnetic circuit module, a color picking switch and a wireless transmission module. When the pen body is held by a user, the pen body is operable on the digital pad. The electromagnetic circuit module is disposed within the pen body. When the pen body is operated by the user, the electromagnetic circuit module issues an electromagnetic signal to the digital pad, and the digital pad implements an input action according to the electromagnetic signal. At least a portion of the color picking switch is exposed outside the pen body. When the color picking switch is pressed by the user, a color picking signal is generated. The wireless transmission module is disposed within the pen body and electrically connected with the color picking switch. The color picking signal is transmitted to the digital pad through the wireless transmission module. After the color picking signal is acquired by the digital pad, a color shown on the screen image and pointed through the digital pen is picked according to the color picking signal.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
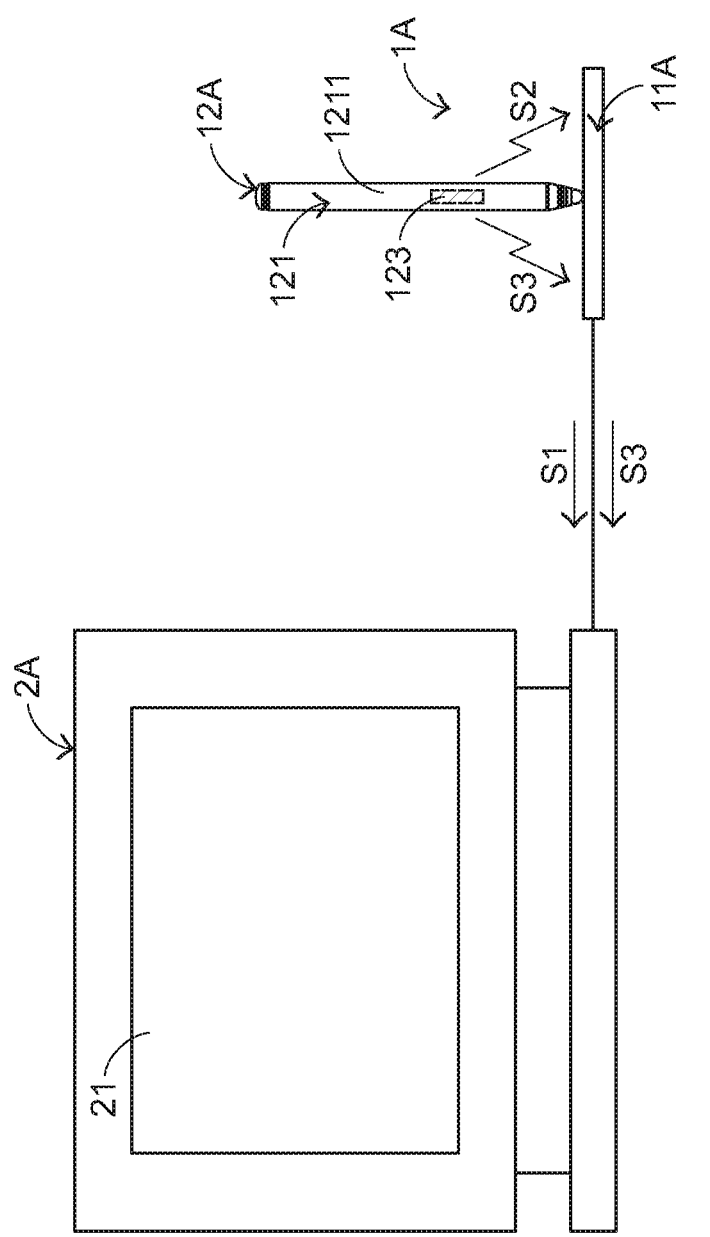
FIG. 1 schematically illustrates a usage concept of an input device according to a first embodiment of the present invention.
Figure 2:
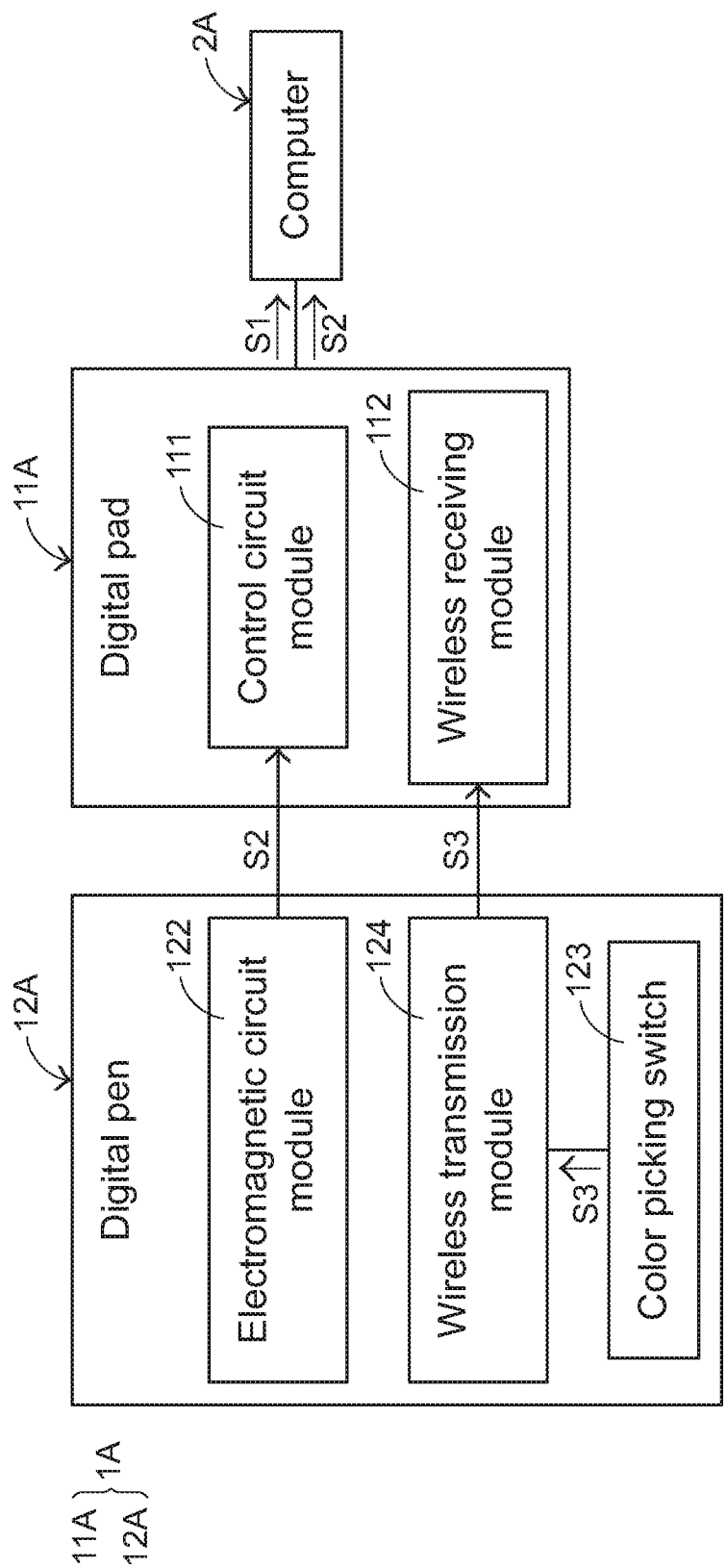
FIG. 2 is a schematic block diagram illustrating the communication between the input device of FIG. 1 and a computer.

Please refer to FIGS. 1 and 2. FIG. 1 schematically illustrates a usage concept of an input device according to a first embodiment of the present invention. FIG. 2 is a schematic block diagram illustrating the communication between the input device of FIG. 1 and a computer. The input device 1A comprises a digital pad 11A and a digital pen 12A. The digital pad 11A is in communication with the computer 2A. In the embodiment of FIG. 1, the digital pad 11A is in communication with the computer 2A in a wired connection manner. Alternatively, the digital pad 11A is in communication with the computer 2A in a wireless connection manner. When the user holds the digital pen 12A to perform an operation on the digital pad 11A, the information about the operation is sensed by the digital pad 11A and a corresponding input signal S1 is transmitted from the digital pad 11A to the computer 2A. According to the input signal S1, the computer 2A implements a corresponding input action. For example, when the input action is implemented, the handwriting content or the hand-drawing content on the digital pad 11A through the use of the digital pen 12A is shown on a display screen 21 of the computer 2A.

In an embodiment, the digital pad 11A is a graphics tablet. Moreover, the digital pad 11A comprises a control circuit module 111. The digital pen 12A comprises a pen body 121 and an electromagnetic circuit module 122. The electromagnetic circuit module 122 is disposed within the pen body 121. The electromagnetic circuit module 122 comprises an oscillation circuit, which is composed of an inductor, a capacitor and associated components. When the user holds the pen body 121 to write or draw on the digital pad 11A, the inductance value or the inductance value of the electromagnetic circuit module 122 undergoes a continuous change. According to the continuous change of the inductance value or the inductance value, a corresponding electromagnetic signal S2 is generated. After the electromagnetic signal S2 from the digital pen 12A is received by the control circuit module 111 of the digital pad 11A, the electromagnetic signal S2 is converted into an input signal S1 by the control circuit module 111. Then, the input signal S1 is transmitted to the computer 2A. According to the input signal S1, the computer 2A acquires the coordinate information of the digital pen 12A on the digital pad 11A and the pressure level of using the digital pen 12A. Consequently, the handwriting content or the hand-drawing content on the digital pad 11A through the use of the digital pen 12A is shown on the display screen 21 of the computer 2A.

In this embodiment, the digital pad 11A further comprises a wireless receiving module 112, and the digital pen 12A further comprises a color picking switch 123 and a wireless transmission module 124. The wireless transmission module 124 is connected with the color picking switch 123. At least a portion of the color picking switch 123 is exposed outside the pen body 121. When the user holds the pen body 121 to write or draw on the digital pad 11A, the user may press the color picking switch 123. Consequently, the color shown on the screen image of the display screen 21 of the computer 2A and pointed through the pen body 121 is picked.

For example, when the user intends to use a specified color shown on the screen image of the display screen 21 to implement the subsequent action, the user may move the digital pen 12A on the digital pad 11A to point the specified color on the display screen 21. Then, the color picking switch 123 of the digital pen 12A is pressed. After the color picking switch 123 is pressed, the color picking switch 123 issues a color picking signal S3. The color picking signal S3 is transmitted to the wireless receiving module 112 of the digital pad 11A through the wireless transmission module 124 of the digital pen 12A. Then, the color picking signal S3 is transmitted to the computer 2A through the digital pad 11A. According to the color picking signal S3, the color pointed through the digital pen 12A is picked by the computer 2A. Consequently, the subsequent writing or drawing contents have the picked color.

In an embodiment, the wireless transmission module 124 of the digital pen 12A is a Bluetooth transmission module, the wireless receiving module 112 of the digital pad 11A is a Bluetooth receiving module, and the color picking switch 123 is a touch-sensitive switch. Preferably but not exclusively, the pen body 121 of the digital pen 12A has a grasping surface 1211. Moreover, the region between the color picking switch 123 and the grasping surface 1211 is a non-protruded flat surface. Consequently, when the pen body 121 of the digital pen 12A is held to write or draw, the color picking switch 123 will not become hindrance from operating the digital pen 12A.

It is noted that numerous modifications and alterations may be made while retaining the teachings of the invention. For example, in another embodiment, the wireless transmission module 124 of the digital pen 12A is a 2.4G wireless radio frequency transmission module, and the wireless receiving module 112 of the digital pad 11A is a 2.4G wireless radio frequency receiving module. Moreover, in another embodiment, the color picking switch 123 of the digital pen 12A is a pressure sensitive switch or a physical key switch.

Figure 3:
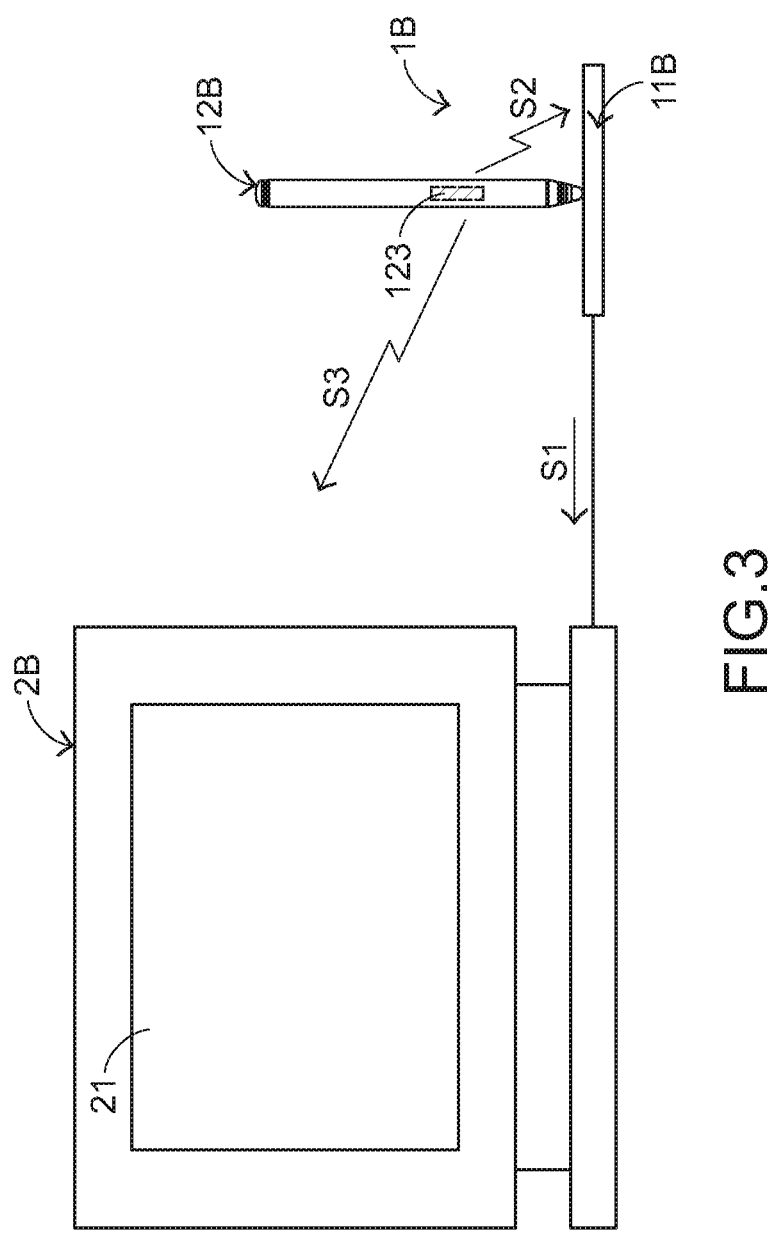
FIG. 3 schematically illustrates a usage concept of an input device according to a second embodiment of the present invention.
Figure 4:
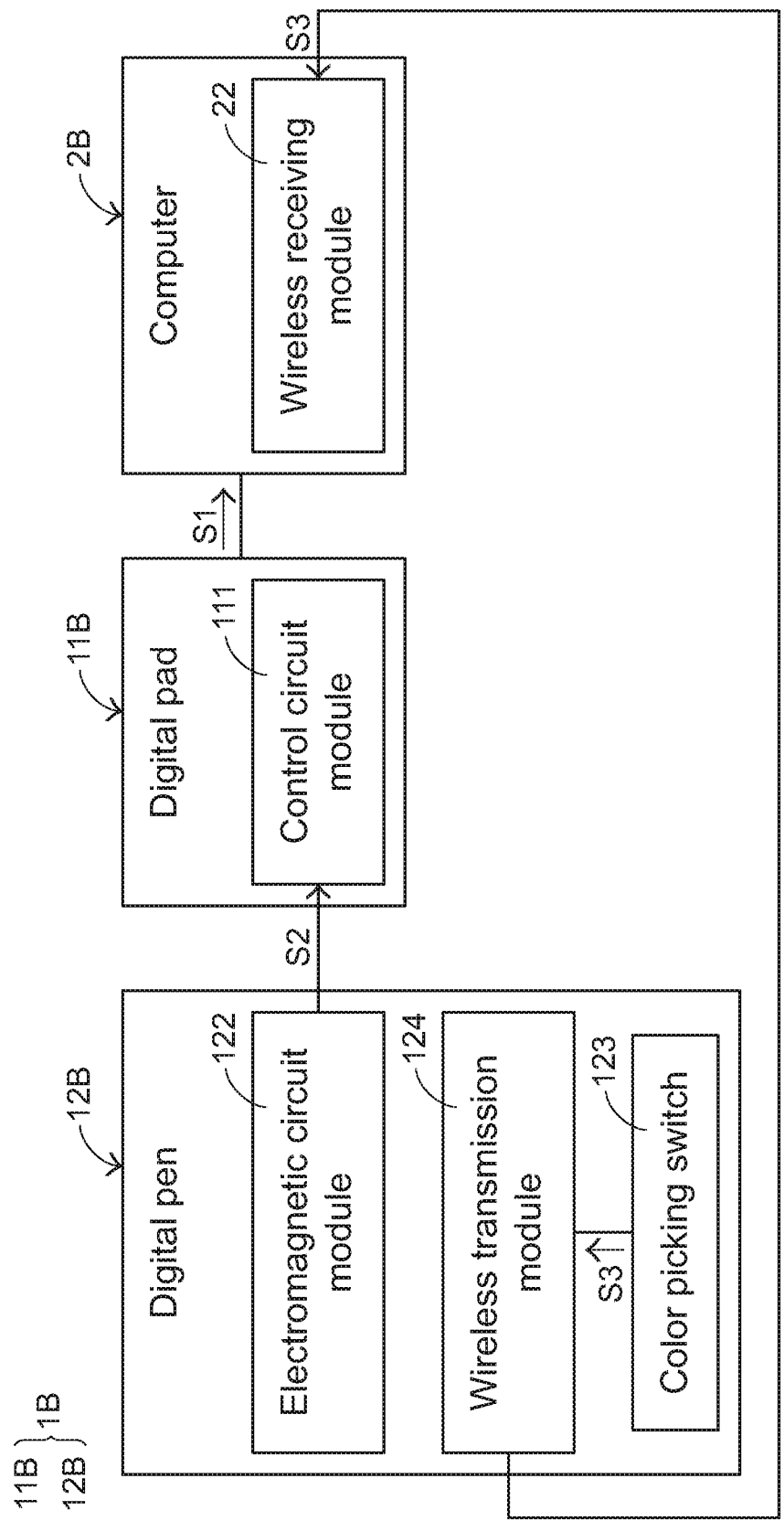
FIG. 4 is a schematic block diagram illustrating the communication between the input device of FIG. 3 and a computer.

Please refer to FIGS. 3 and 4. FIG. 3 schematically illustrates a usage concept of an input device according to a second embodiment of the present invention. FIG. 4 is a schematic block diagram illustrating the communication between the input device of FIG. 3 and a computer. Component parts and elements corresponding to those of the first embodiment are designated by identical numeral references, and detailed descriptions thereof are omitted. Similarly, the input device 1B of this embodiment comprises a digital pad 11B and a digital pen 12B. In comparison with the first embodiment, the computer 2B in communication with the digital pad 11B of this embodiment further comprises a wireless receiving module 22B.

When the user presses the color picking switch 123 of the digital pen 12B, the color picking switch 123 issues a color picking signal S3. The color picking signal S3 is directly transmitted to the wireless receiving module 22B of the computer 2B through the wireless transmission module 124 of the digital pen 12B. That is, the computer 2B acquires the color picking signal S3 not through the digital pad 11B. Similarly, according to the color picking signal S3, the color pointed through the digital pen 12B is picked by the computer 2B. Consequently, the subsequent writing or drawing contents have the picked color.

Figure 5:
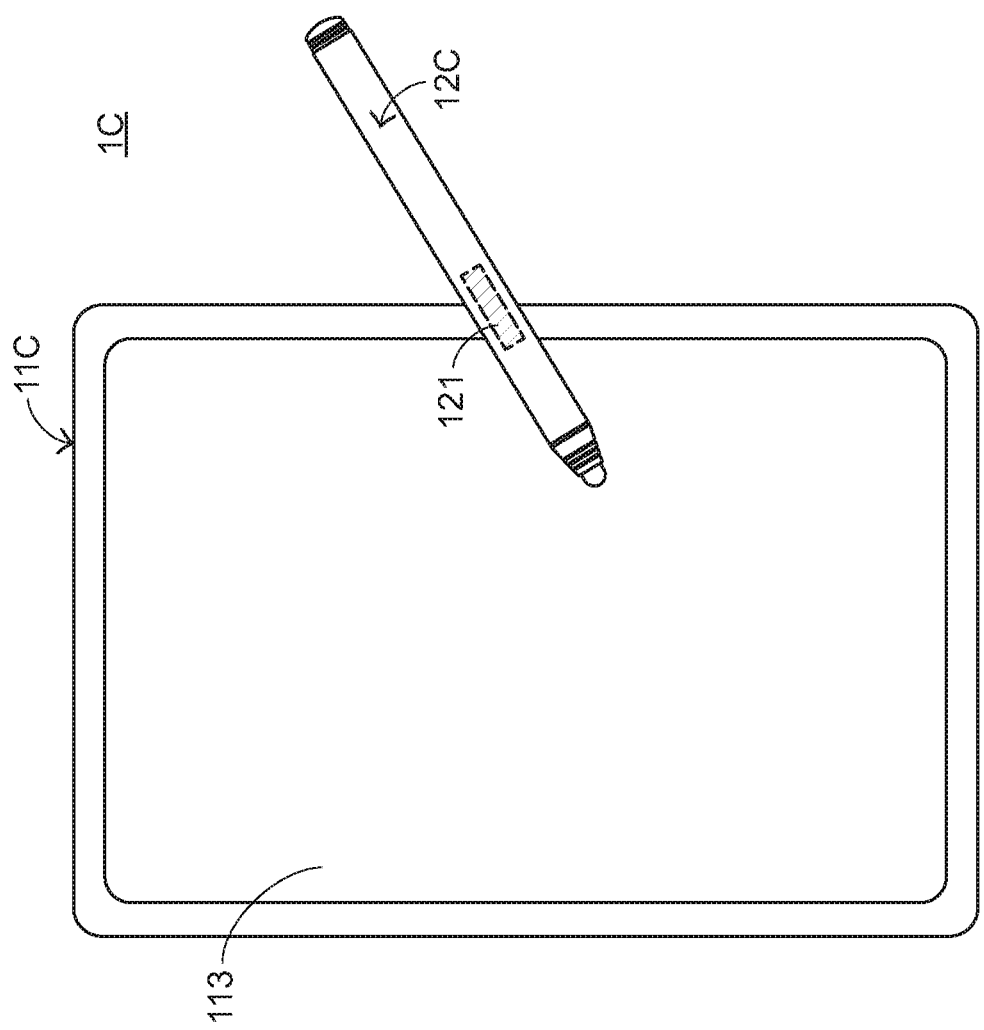
FIG. 5 schematically illustrates a usage concept of an input device according to a third embodiment of the present invention.
Figure 6:
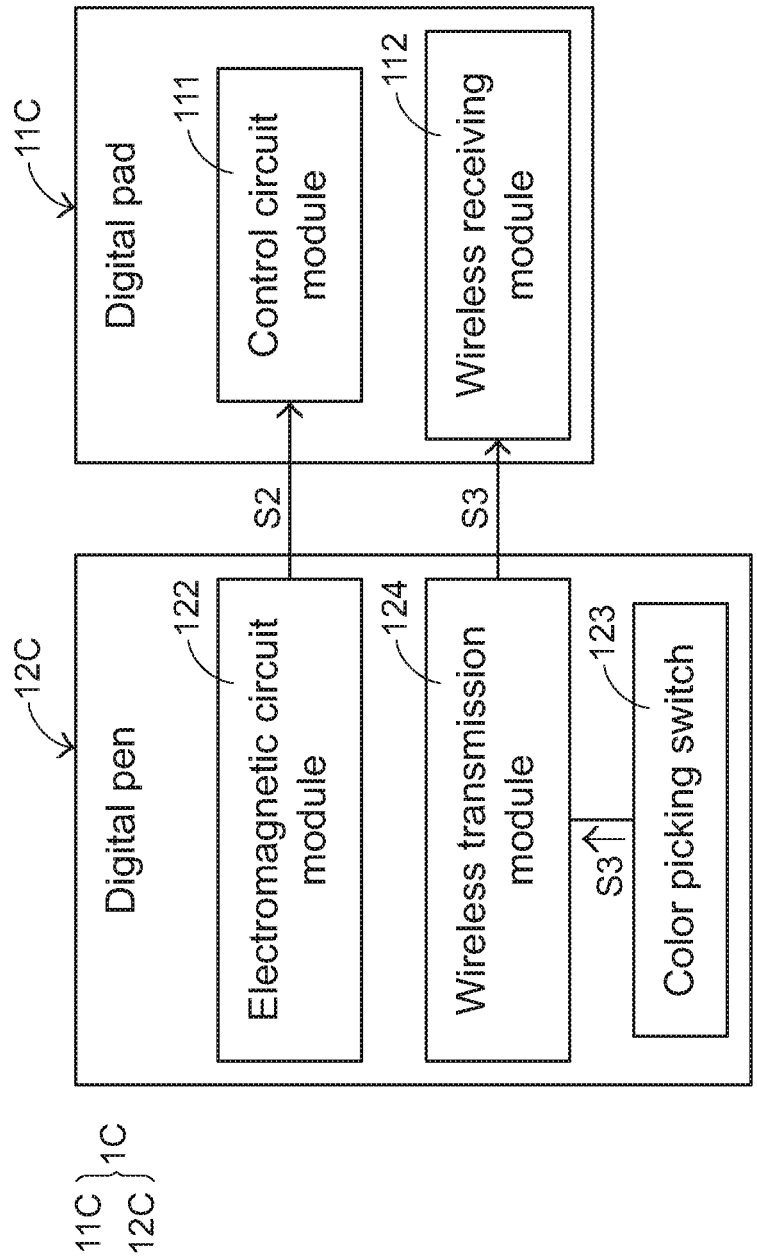
FIG. 6 is a schematic block diagram illustrating the communication between the input device of FIG. 5 and a computer.

Please refer to FIGS. 5 and 6. FIG. 5 schematically illustrates a usage concept of an input device according to a third embodiment of the present invention. FIG. 6 is a schematic block diagram illustrating the communication between the input device of FIG. 5 and a computer. Component parts and elements corresponding to those of the first embodiment are designated by identical numeral references, and detailed descriptions thereof are omitted. Similarly, the input device 1C of this embodiment comprises a digital pad 11C and a digital pen 12C. In comparison with the first embodiment, the digital pad 11C is a touch screen that shows an image and allows the user to perform a touch control operation. When the user holds the digital pen 12C to click, write or draw on the digital pad 11C, the information about the operation is sensed by the digital pad 11C. Consequently, the input device 1C implements a corresponding input action. For example, when the input action is implemented, the handwriting content or the hand-drawing content on the digital pad 11C through the use of the digital pen 12C is shown on a display screen 113 of the digital pad 11C.

When the user holds the pen body 121 to write or draw on the digital pad 11C, the inductance value or the inductance value of the electromagnetic circuit module 122 undergoes a continuous change. According to the continuous change of the inductance value or the inductance value, a corresponding electromagnetic signal S2 is generated. After the electromagnetic signal S2 from the digital pen 12C is received by the control circuit module 111 of the digital pad 11C, the electromagnetic signal S2 is processed by the control circuit module 111. Consequently, the control circuit module 111 of the digital pad 11C acquires the coordinate information of the digital pen 12C on the digital pad 11C and the pressure level of using the digital pen 12C. Consequently, the handwriting content or the hand-drawing content on the digital pad 11C through the use of the digital pen 12C is shown on the display screen 113 of the digital pad 11C.

Similarly, the digital pad 11C further comprises a wireless receiving module 112. When the user intends to use a specified color shown on the screen image of the display screen 113 of the digital pad 11C to implement the subsequent action, the user may move the digital pen 12C on the digital pad 11C to point the specified color. Then, the color picking switch 123 of the digital pen 12C is pressed. After the color picking switch 123 is pressed, the color picking switch 123 issues a color picking signal S3. The color picking signal S3 is transmitted to the wireless receiving module 112 of the digital pad 11C through the wireless transmission module 124 of the digital pen 12C. After the color picking signal S3 is received by the digital pad 11C, the color pointed through the digital pen 12C is picked by the digital pad 11C. Consequently, the subsequent writing or drawing contents have the picked color.

From the above descriptions, the present invention provides the input device. When the input device is used to write or draw and the user intends to pick a color shown on the screen image of the computer or the digital pad to implement the subsequent action, it is not necessary to select the eyedropper tool (or the color picker) of the editing program. Instead, when the color picking switch of the digital pen is pressed by the user, the purpose of picking the color is achieved. Consequently, the input device of the present invention can effectively enhance the working efficiency of the user. In other words, the input device of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A digital pen, comprising:
a pen body, operable on a digital pad;
an electromagnetic circuit module disposed within the pen body, wherein the electromagnetic circuit module issues an electromagnetic signal to the digital pad when the pen body is in operation, and the digital pad or a computer having a display screen in communication with the digital pad implements an input action according to the electromagnetic signal;
a color picking switch, wherein at least a portion of the color picking switch is exposed outside the pen body and a color picking signal is generated when a specific color shown on a screen image of the display screen is pointed at by the digital pen and the color picking switch is pressed; and
a wireless transmission module disposed within the pen body and electrically connected with the color picking switch, wherein the color picking signal is outputted through the wireless transmission module, and the specific color shown on the screen image pointed at by the digital pen is picked according to the color picking signal.

2. The digital pen according to claim 1, wherein the digital pad is a graphics tablet, and the graphics tablet is in communication with the computer.

3. The digital pen according to claim 2, wherein the graphics tablet further comprises a wireless receiving module to receive the color picking signal from the wireless transmission module, and the computer acquires the color picking signal through the digital pad, and after the color picking signal is acquired, the specific color is picked according to the color picking signal for subsequent writing or drawing.

4. The digital pen according to claim 2, wherein the computer further comprises a wireless receiving module to receive the color picking signal from the wireless transmission module, wherein after the color picking signal is received by the wireless receiving module, the specific color is picked according to the color picking signal for subsequent writing or drawing.

5. The digital pen according to claim 1, wherein the digital pad is a touch screen.

6. The digital pen according to claim 5, wherein the digital pad further comprises a wireless receiving module to receive the color picking signal from the wireless transmission module, wherein after the color picking signal is received by the wireless receiving module, the specific color is picked according to the color picking signal for subsequent writing or drawing.

7. The digital pen according to claim 1, wherein the color picking switch is a touch-sensitive switch or a pressure sensitive switch.

8. The digital pen according to claim 7, wherein the pen body has a grasping surface, and a region between the color picking switch and the grasping surface is a non-protruded flat surface.

9. The digital pen according to claim 1, wherein the color picking switch is a physical key switch.

10. The digital pen according to claim 1, wherein the wireless transmission module is a Bluetooth transmission module or a 2.4G wireless radio frequency transmission module.

11. An input device, comprising:
a digital pad in communication with a computer having a display screen; and
a digital pen comprising:
a pen body, operable on the digital pad;
an electromagnetic circuit module disposed within the pen body, wherein when the electromagnetic circuit module issues an electromagnetic signal to the digital pad when the pen body is in operation, the computer implements an input action according to the electromagnetic signal;
a color picking switch, wherein at least a portion of the color picking switch is exposed outside the pen body and a color picking signal is generated when a specific color shown on a screen image of the display screen is pointed at by the digital pen and the color picking switch is pressed; and
a wireless transmission module disposed within the pen body and electrically connected with the color picking switch, wherein the color picking signal is transmitted to the digital pad or the computer through the wireless transmission module, and after the color picking signal is acquired by the computer, the specific color shown on the screen image of the computer pointed at by the digital pen is picked according to the color picking signal.

12. The input device according to claim 11, wherein the digital pad is a graphics tablet, and the graphics tablet comprises a control circuit module, wherein after the electromagnetic signal from the electromagnetic circuit module is received by the control circuit module, the electromagnetic signal is converted into an input signal by the control circuit module, and the computer implements the input action according to the input signal.

13. The input device according to claim 12, wherein one of the graphics tablet and the computer further comprises a wireless receiving module to receive the color picking signal from the wireless transmission module, and when the graphics tablet comprises the wireless receiving module, the computer acquires the color picking signal through the digital pad, and the specific color is picked for subsequent writing or drawing according to the color picking signal, and when the computer comprises the wireless receiving module, the specific color is picked for subsequent writing or drawing according to the color picking signal after the color picking signal is received by the wireless receiving module.

14. The input device according to claim 11, wherein the color picking switch is a touch-sensitive switch or a pressure sensitive switch.

15. The input device according to claim 11, wherein the pen body has a grasping surface, and a region between the color picking switch and the grasping surface is a non-protruded flat surface.

16. The input device according to claim 11, wherein the wireless transmission module is a Bluetooth transmission module or a 2.4G wireless radio frequency transmission module.

17. An input device, comprising:
a digital pad, wherein a screen image is shown on the digital pad; and
a digital pen comprising:
a pen body, operable on the digital pad;
an electromagnetic circuit module disposed within the pen body, wherein the electromagnetic circuit module issues an electromagnetic signal to the digital pad when the pen body in in operation, and the digital pad implements an input action according to the electromagnetic signal;
a color picking switch, wherein at least a portion of the color picking switch is exposed outside the pen body and a color picking signal is generated when a specific color shown in the screen image is pointed at by the digital pen and the color picking switch is pressed; and
a wireless transmission module disposed within the pen body and electrically connected with the color picking switch, wherein the color picking signal is transmitted to the digital pad through the wireless transmission module, and after the color picking signal is acquired by the digital pad, the specific color shown on the screen image and pointed at by the digital pen is picked according to the color picking signal.

18. The input device according to claim 17, wherein the color picking switch is a touch-sensitive switch or a pressure sensitive switch.

19. The input device according to claim 18, wherein the pen body has a grasping surface, and a region between the color picking switch and the grasping surface is a non-protruded flat surface.

20. The input device according to claim 17, wherein the wireless transmission module is a Bluetooth transmission module or a 2.4G wireless radio frequency transmission module.

* * * * *